United States Patent [19]

Craft et al.

[11] 3,770,531

[45] Oct. 30, 1973

[54] BONDING SUBSTANCE FOR THE FABRICATION OF INTEGRATED CIRCUITS

[75] Inventors: William Henry Craft, Somerville; Harold Schonhorn, New Providence, both of N.J.

[73] Assignee: Bell Telephone Laboratories, Incorporated, Murray Hill, N.J.

[22] Filed: May 4, 1972

[21] Appl. No.: 250,257

Related U.S. Application Data

[63] Continuation-in-part of Ser. No. 139,008, April 30, 1971, abandoned.

[52] U.S. Cl. .......................................... 156/3, 156/7

[51] Int. Cl. .............................................. H011 7/50

[58] Field of Search ................................... 156/3, 7

[56] References Cited

UNITED STATES PATENTS 3,152,939 10/1964 Borneman et al. ............... 156/17 X 3,494,023 2/1970 Dorendorf ........................ 156/17 X

*Primary Examiner*—William A. Powell

*Attorney*—R. J. Guenther et al.

[57] ABSTRACT

A process is described for fabricating semiconductor elements such as integrated circuit chips from semiconductor wafers in which a hydrocarbon polymer material is used as a bonding material. This process involves incorporating circuits on a semiconductor wafer and bonding the circuit side of the semiconductor wafer to a substrate before final fabrication of the semiconductor chips. Of particular importance in this process are the physical and chemical properties of the bonding material. Atactic polypropylene is particularly suitable as a bonding material in this process.

5 Claims, 2 Drawing Figures

BONDING SUBSTANCE FOR THE FABRICATION OF INTEGRATED CIRCUITS

CROSS REFERENCE TO RELATED APPLICATION

This application is a continuation-in-part of my copending application, Ser. No. 139,008, filed Apr. 30, 1971, now abandoned.

BACKGROUND OF THE INVENTION

1. Field of the Invention

The invention relates to a process for fabricating semiconducting elements and in particular integrated circuits from semiconductor material.

2. Description of the Prior Art

In the fabrication of semiconducting elements it is often necessary to bond semiconductor material to a substrate so as to further process the semiconductor material. In many processes, as for example in the fabrication of integrated circuit chips, the face of a semiconducting wafer on which circuit elements have already been incorporated is bonded to the substrate in order to facilitate further processing. Often this further processing involves etching away material, lapping or grinding away semiconductor material, etc. When this processing is completed the individual integrated circuits are often of very small size and difficult to handle. Rather sophisticated techniques have been developed for removing these integrated circuit chips from the substrate and incorporating the chips into larger circuits. Commonly, semiconductor chips are separated from the substrate by melting the bonding material. Since the number of semiconductor chips on each substrate is often quite large (several hundred or more) and often only a few chips are removed at a given time, the bonding material may be exposed to the melting temperature many times over long periods of time before all of the semiconductor chips are removed.

Many of the problems involved in the handling of semiconductor elements, such as integrated circuit chips, are associated with the bonding of the semiconductor wafers to the substrate. For example, variation in the bonding characteristics of the bonding material, both from point-to-point on the substrate at a given time and after extensive thermal recycling, is undesirable because of the uncertainty in initial adherence of the semiconductor elements and in obtaining release of the semiconductor chip under particular conditions. This problem is particularly significant where rapid computerized techniques are used to remove the chips from the substrate since failure of the chip to release, or premature release of the chip, interrupts the entire chip removal process.

Contamination from the bonding material is also a particular problem in handling semiconductor chips. Since the bonding material is actually in contact with the semiconductor surface containing these circuit elements, the bonding material must be such as not to alter the characteristics of these circuit elements. For this reason certain bonding materials are not suitable as for example those which are corrosive or become corrosive under conditions used in the semiconductor processing.

The bonding process should not be affected by the use of etchants usually used in processing the semiconductor wafer. For this reason the bonding material should preferably be inert to the etchants used in processing or, if not completely inert, at least not so affected by the etchants as to alter significantly its bonding characteristics or yield corrosive material which might be deleterious to the semiconductor circuit.

SUMMARY OF THE INVENTION

The invention is a process for the fabrication of semiconductor elements and in particular integrated circuits in which atactic polypropylene is used as a bonding material to bond semiconductor slices to a substrate. This bonding material meets the requirements of this fabrication process in that it forms bonds of uniform strength and release temperature and these characteristics are not affected by repeated thermal cycling in the temperature range used in the fabrication process. Furthermore, it is not affected by the etch materials used in the fabrication process and does not alter the circuit characteristics of these semiconducting elements. Essentially pure atactic polypropylene is used as the bonding material because it is most compatible with the fabrication process and is highly stable. The bonding material may include additives such as stabilizers and anti-oxidants commonly found in polymer preparations. Typically these additives would not exceed 1 percent by weight. Pure atactic polypropylene implies complete randomization of the branching chain. Some alignment of the branching chains can be tolerated without adverse effects on the fabrication process. Small amounts of other unsubstituted hydrocarbon polymers may also be included in the bonding material, but this should not exceed 10 percent by weight. The average molecular weight of the polymer bonding material is between 2,000 and 20,000 and is adjusted so as to obtain a particular release temperature.

DETAILED DESCRIPTION

1. Fabrication Process

Figure 2:
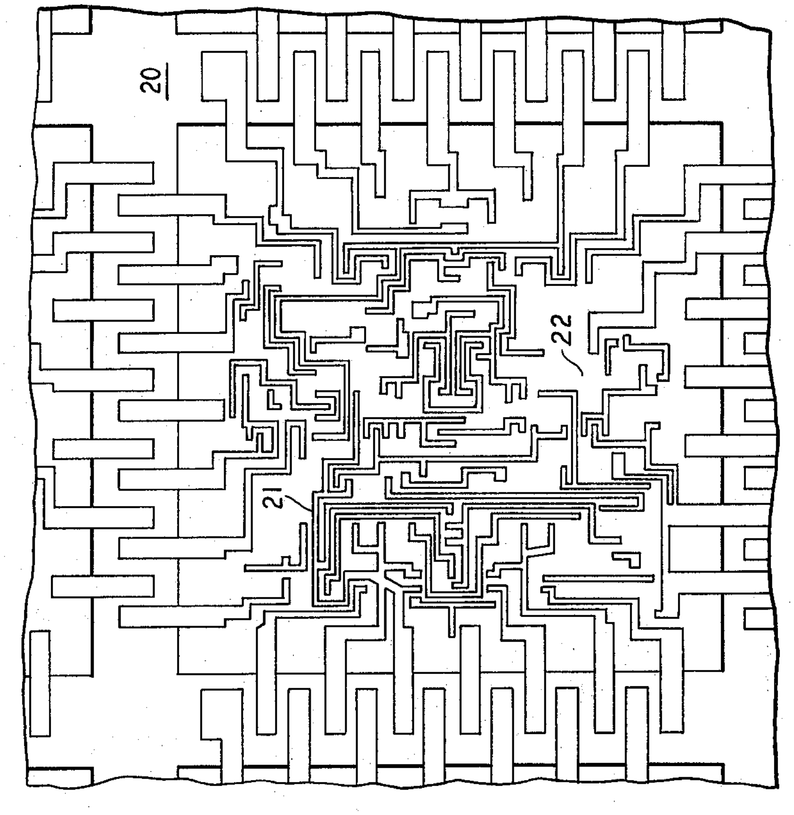
FIG. 2 is a plan view under high magnification of a circuit chip bonded to a substrate showing some of the circuit features on the chip.

Fabrication of the semiconducting elements begins with extensive processing of a semiconductor wafer. This involves, amongst other things, photoetching of the wafer and doping of the wafer. The result is the incorporation of a large number of semiconducting elements on the wafer. At present this might involve the incorporation of several hundred individual circuit elements on the wafer. Further processing involves thinning down of the wafer and separation of the individual semiconducting circuit elements or integrated chips. The latter two steps in the process are expeditiously carried out by bonding the semiconductor wafer to a substrate so as to provide support for the wafer during any subsequent processing such as grinding or lapping of the semiconductor wafer, and to prevent loss of the individual circuit chips after separation. The characteristics of the bonding material must be compatible with these processing steps. For example, the bonding strength must be sufficient to prevent separation of the wafer from the substrate during the grinding and lapping operations. Thereafter the semiconductor is exposed to further processing in order to separate the individual semiconducting elements. This involves exposure of the wafer and bonding materials to various kinds of etching substances. After exposure of the bonding material to any of the various etching processes the bonding material must continue to have the desirable characteristics enumerated above.

Further processing involves the separation of the individual semiconductor elements from the substrate. This is particularly difficult because of the small size of these individual semiconducting elements or chips as they are usually called. For economic reasons, rapid handling of these chips is desirable. Such handling rates as 800–1,000 chips per hour are often required in many instances. Elaborate automatic transfer schemes have been developed for handling semiconductor chips. Computerized techniques are often used so as to obtain rapid access to any semiconductor chip and as a means to determine which chips have already been removed in these systems. The properties of the bonding material are particularly crucial. The bond formed by the bonding material should be uniform throughout the substrate. It should consistently release the individual chips when heated to the release temperature. Repeatedly heating the substrate to the release temperature should not appreciably change the properties of the bonding material. Before incorporating a chip into a circuit, removal of the remaining bonding material from a chip might be required.

2. Properties of the Bonding Material

The basic polymer atactic polypropylene with the usual additives such as stabilizers and anti-oxidants is the preferred bonding material because it best meets the requirements for the process of fabricating the semiconductor chips. This bonding material yields uniform bonds throughout the substrate surface and also results in bonds with uniform release temperatures. In addition, thermal cycling through the temperature ranges used in the transfer technique does not result in alteration of the bonding characteristics or release temperature.

Atactic polypropylene implies complete randomization of the side chains on the polypropylene polymer. Such complete randomization is often difficult to produce in the polymerization process. Some alignment of the branch chains can be tolerated without adverse effects to the semiconductor processing conditions. A high degree of alignment results in among other things local areas of poor adhesion. This alignment is evidenced by the polymer becoming partly crystalline whereas pure atactic polypropylene is completely amorphous. Up to 10 weight percent crystallinity can be tolerated without adverse effects to the semiconductor processing conditions. Percent crystallinity is conveniently determined from data on the heat of fusion of the bonding material. Atactic polypropylene, being completely amorphous, has no heat of fusion whereas isotactic polypropylene is essentially crystalline and has a heat of fusion of 2.60 kcal/monomer unit (see Polymer Single Crystals by Phillip H. Geil, Interscience Publishers, New York, 1963, Appendix I). Thus, less than 10 percent by weight crystallinity implies that the heat of fusion of the bonding material is less than 0.26 kcal/monomer unit. Small amounts of other unsubstituted hydrocarbon polymers may also be included alternatively in the bonding material without serious adverse effects. The range of average molecular weight of the atactic polypropylene k2 between 2,000 and 20,000. This may be adjusted in order to obtain a desired release temperature.

The bonding material was found to be impervious to the usual etchants and chemicals used in semiconductor processing. Furthermore, exposure of the bonding material to photolithographic processing which is often used in semiconductor technology had no adverse effect on the bonding material.

In addition, the bonding material remains clear even after repeated thermal cycling so that visual inspection may continuously take place. Residual bonding material as well as small amounts of decomposed bonding material can easily be removed from the integrated circuits by conventional solvents such as trichloroethylene, carbon tetrachloride, benzene, etc.

A desirable characteristic of bonds made from atactic polypropylene is that they are clear, which permits easy observation of the semiconductor wafers. Atactic polypropylene presently available from commercial sources is a by-product of the production of isotactic polypropylene. Isotactic polypropylene is removed from ordinary polypropylene leaving a residue which is sold commercially as atactic polypropylene. The properties of this residue product are somewhat variable. For example, the molecular weight varies from batch to batch which in turn alters the viscosity at a given temperature. With some batches obtained commercially, the viscosity is sufficiently high in the temperature range in which the bonding operation is carried out (typically between 120°–150° C) that the bond is formed in a wedge shape (non-parallel to the surface of the substrate). This occurs because the viscosity is not low enough to permit the bonding material to be pushed out from between the semiconductor wafer (the side having the circuit element) and the support disk or substrate. Although these wedge-shaped bonds are perfectly satisfactory from mechanical and release standpoints, they cause undesirable effects on further processing. In preparation to etching apart the individual circuit chips, the semiconductor wafer is thinned down by, for example, grinding or lapping. Since the bond between the semiconductor wafer and substrate is wedge-shaped, the thickness of the wafer varies across its surface. Percentage variation increases as the thickness of the wafer decreases. When the wafer is etched, the thinner parts of the wafer break through first causing undercutting (etching back of the sides of the chip) while the thicker parts of the wafer still require more etching. This undercutting decreases the chip size and cuts into the part of the chip where the circuitry and anchoring elements are located.

In accordance with the invention, variability in viscosity of the bonding material is minimized while retaining many of the desirable properties of the atactic polypropylene by adding up to 60 percent polyethylene with weight average molecular weight from 10,000 to 50,000. Although use of this bonding material leads to bonds of lower transparency, in practice, bonding material of low viscosity is obtained more reliably.

3. The Integrated Circuits

Figure 1:
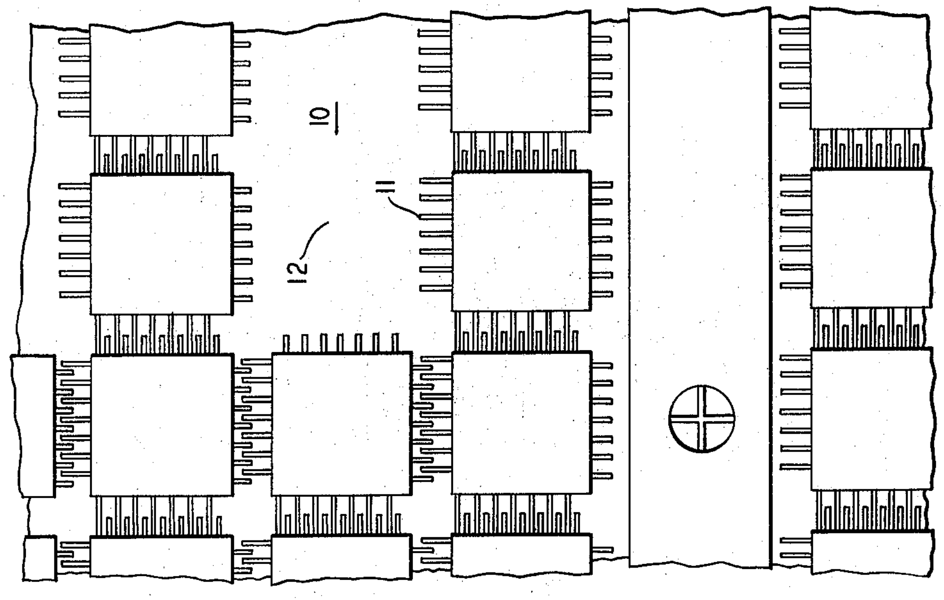
FIG. 1 is a plan view of part of a substrate showing some integrated circuit ships bonded to the substrate and parts of the substrate where circuit chips have been removed.

FIG. 1 shows a portion of a substrate with the semiconductor slab 10 already processed into individual integrated circuits and conducting beam leads 11. FIG. 1 shows the surface containing the semiconductor elements as viewed through the substrate. Some of the individual circuit chips have been removed using the inventive process. The bonding material is applied on the substrate surface 12 in contact with the surface of the semiconductor slab containing the circuits. Here the substrate is made of sapphire and the semiconductor material is silicon. However, similar results are obtained with substrates made from other materials such as glass, ceramic, quartz, aluminum oxide, etc. Also, the process is applicable to other semiconductors besides silicon such as germanium, gallium phosphide, gallium arsenide, etc.

FIG. 2 shows an integrated circuit chip 20 under high magnification. Here the individual features of the integrated circuit, such as conducting paths 21 and semiconducting material 22, can be observed through the inventive bonding material and sapphire substrate.

4. Example

Processing began with a wafer of silicon. This wafer was subjected to various treatments such as etching and doping procedures so as to incorporate a large number of circuits on the silicon wafer. At this stage of the processing the silicon wafer contained a large number of individual circuits together with deposited metal which after further processing become beam leads for each of these individual circuits. The silicon wafer was then bonded to a sapphire substrate as follows. The substrate was heated to a temperature of approximately 200° C and a small amount of atactic polypropylene was introduced onto the surface of the substrate in order to produce a thin film of bonding material. The circuit side of the silicon wafer was then bonded to the substrate by pressing the two together.

The silicon wafer now bonded to the substrate was subjected to further processing so as to separate the individual circuit chips. The silicon wafer was first thinned down by lapping the exposed side of the wafer. The wafer was then exposed to an etching procedure which separates the individual circuit chips.

Removal of the individual circuit chips was accomplished as follows. The substrate was placed on a stage and heated to about 125° C. This softens the bonding material sufficiently so that the circuit chip can be removed from the substrate. Circuit chips were removed with a thermode pick-up device. This device has a vacuum actuated tip to which the chip adheres. The thermode was maintained at a temperature of about 500° C. The thermode was computer operated and was programmed in such a way that it can pick up any particular chip on the substrate and also keeps track of which chips had been removed from the substrate.

What is claimed is:

1. A process for fabricating a plurality of semiconductive elements from a semiconductor body comprising the steps of a. producing the plurality of semiconducting elements on the semiconductor body, b. bonding the semiconductor body to a substrate such that the side of the semiconductor body containing the semiconductor elements is bonded to the substrate, c. chemically treating the semiconductor body to divide into individual semiconductor elements, and d. removing the divided semiconductor elements, characterized in that a bonding material containing from 0 to 60 percent polyethylene, the remainder at least 90 percent by weight atactic polypropylene is used in the bonding process and removing of the individual semiconductor elements is by heating.

2. The process of claim 1 in which the bonding substance consists essentially of atactic polypropylene.

3. The process of claim 1 in which the semiconducting elements consist essentially of integrated circuits.

4. The process of claim 1 in which the bonding material consists essentially of 90 percent by weight atactic polypropylene and the remainder isotactic polypropylene.

5. The process of claim 1 in which the bonding material contains 0 percent polyethylene.

* * * * *